(12) United States Patent
Kim et al.

(10) Patent No.: US 7,595,255 B2
(45) Date of Patent: Sep. 29, 2009

(54) METHOD FOR MANUFACTURING STRIP LEVEL SUBSTRATE WITHOUT WARPAGE AND METHOD FOR MANUFACTURING SEMICONDUCTOR PACKAGE USING THE SAME

(75) Inventors: Seong Cheol Kim, Gyeongsangnam-do (KR); Myung Geun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 126 days.

(21) Appl. No.: 11/760,048

(22) Filed: Jun. 8, 2007

(65) Prior Publication Data

US 2008/0280397 A1  Nov. 13, 2008

(30) Foreign Application Priority Data

May 11, 2007  (KR)  ............... 10-2007-0045946

(51) Int. Cl.
*H01L 21/30* (2006.01)
*H01L 21/46* (2006.01)
(52) U.S. Cl. .................................................. 438/457
(58) Field of Classification Search ................ 438/460, 438/462, 457
See application file for complete search history.

(56) References Cited

U.S. PATENT DOCUMENTS

| 6,780,746 | B2* | 8/2004 | Kinsman et al. | ............ 438/612 |
| 7,211,500 | B2* | 5/2007 | Chen et al. | .................. 438/460 |
| 2002/0132450 | A1* | 9/2002 | Nose | .......................... 438/460 |
| 2007/0095566 | A1 | 5/2007 | Nishida | |

FOREIGN PATENT DOCUMENTS

| JP | 2007-019394 A | 1/2007 |
| KR | 1998-066788 A | 10/1998 |

\* cited by examiner

*Primary Examiner*—David A Zameke
*Assistant Examiner*—Jenny L Wagner
(74) *Attorney, Agent, or Firm*—Ladas & Parry LLP

(57) ABSTRACT

A strip level substrate is manufactured by: applying solder resist on a substrate including a plurality of unit substrate divided by a scribe line; and patterning the applied solder resist to expose an electrode terminal and a ball land in each unit substrate, wherein the patterning of the solder resist is performed to be removed together with a solder resist part applied on the scribe line in order to reduce an early warpage of the strip level substrate.

10 Claims, 12 Drawing Sheets

302  320  310 312

302  320  310 312

METHOD FOR MANUFACTURING STRIP LEVEL SUBSTRATE WITHOUT WARPAGE AND METHOD FOR MANUFACTURING SEMICONDUCTOR PACKAGE USING THE SAME

CROSS-REFERENCE TO RELATED APPLICATIONS

The present application claims priority to Korean patent application number 10-2007-0045946 filed on May 11, 2007, which is incorporated herein by reference in its entirety.

BACKGROUND OF THE INVENTION

The present invention relates to a method for manufacturing a semiconductor package, and more particularly to a method for manufacturing a strip level substrate and method for manufacturing a semiconductor package using the same capable of minimizing an early warpage phenomenon of a strip level substrate.

A sheet of wafer is provided with several hundred or several thousand chips on which the same electrical circuits are printed. However, the printed chips cannot transfer or receive external electrical signals, and further, the chips having fine circuits are easily damaged by external shocks. Therefore, there is a need for a semiconductor package in which the chips are electrically connected, more resistant to external shocks, and sealed and packaged to suit the desired physical function and shape.

Generally, the semiconductor package is manufactured in various structures using various materials, such as a lead frame made of metal, a resin-based printed circuit board on which predetermined circuit paths are integrated or a circuit film, etc.

Use of semiconductor is found in almost all electrical products due to advancement of the electronic industry, and as such various package sizes and shapes are in need. In particular, light-weight, highly-integrated semiconductor chips with rapid processing speed and the packages having right size and shape are especially in need for small electronic devices and mobile products.

Therefore, a recent trend in the industry uses substrates having chip attaching regions in a matrix arrangement structure for improving productivity per unit time. The substrate is subject to a chip attaching process, a wire boding process, and a molding process, etc., and then a sawing or singulation process, etc., which separates the substrate into pieces thereby allowing the contemporaneous manufacture of a plurality of semiconductor packages.

For example, a plurality of semiconductor packages in general are manufactured simultaneously by attaching a semiconductor chip to each unit substrate of a strip level substrate including a plurality of unit substrates, and then performing a wire boding process between the semiconductor chip and the unit substrate while simultaneously performing a molding process, and subsequently sawing them at the unit level.

A conventional semiconductor package is subject to a process to apply and then pattern solder resists on the front surface of the strip level substrate at the time of manufacturing thereof and to expose the electrode terminals and ball lands in each unit substrate.

However, although the facile nature of the process is advantageous, during the process for manufacturing the package, the solder resist applied on the front surface of the strip level substrate repeatedly expands and contracts during the reflow process, causing an early warpage phenomenon on the strip level substrate. As a result, the progress of the process thereafter becomes more difficult and the unit level semiconductor package degrades.

Such a problem also occurs in a flip chip package during the manufacture of a semiconductor package by applying a solder resist on the electrode terminal of a strip level substrate, progressing the reflow and then forming a bump.

Therefore, in order to secure the reliability of a semiconductor package, there has been need for a strip level substrate capable of preventing an early warpage phenomenon.

SUMMARY OF THE INVENTION

Embodiments of the present invention are directed to a method for manufacturing a strip level substrate capable of minimizing an early warpage phenomenon.

Further, embodiments of the present invention are directed to a method for manufacturing a semiconductor package capable of performing whole processes by minimizing the early warpage phenomenon of the strip level substrate.

Also, embodiments of the present invention are directed to a method for manufacturing a semiconductor package where the processes as a whole are simpler such that they are capable of reducing faulty operations and defects.

In one embodiment, a method for manufacturing a strip level substrate includes the steps of: applying a solder resist on a substrate including a plurality of unit substrate divided by a scribe line; and patterning the applied solder resist to expose an electrode terminal and a ball land in each unit substrate, wherein the patterning of the solder resist is performed to be removed together with a solder resist part applied on the scribe line in order to ensure the reduction of early warpage of the strip level substrate.

The patterning of the solder resist is performed to also remove the solder resist applied on the parts of the substrate other than the part that the unit substrate is disposed.

In another embodiment, a method for manufacturing a semiconductor package includes the steps of: applying a solder resist on a strip level substrate including a plurality of unit substrates each including an electrode terminal and a ball land and being divided by a scribe line; patterning the solder resist to expose the electrode terminal, the ball land and the scribe line in each substrate; attaching a semiconductor chip including a bonding pad on each unit substrate; connecting the bonding pad of the semiconductor chip and the electrode terminal of the unit substrate; sealing the upper surface of the strip level substrate to surround the semiconductor chip; attaching the solder ball to the ball land in each unit substrate; and cutting the strip level substrate along the scribe line thereby creating the unit substrates.

The patterning of the solder resist is performed to also remove the solder resist applied on the parts of the strip level substrate other than the part that the unit substrate is disposed.

The electrode terminal is disposed on the edge part of each unit substrate.

The semiconductor chip is attached on the center part of the unit substrate.

Metal wire is used to connect the bonding pad of the semiconductor chip with the electrode terminal of the unit substrate.

In another embodiment, a method for manufacturing a semiconductor package includes the steps of: applying a solder resist on a strip level substrate including a plurality of unit substrates each including an electrode terminal and a ball land and being divided by a scribe line; patterning the solder resist to expose the electrode terminal, the ball land and the scribe line in each substrate; attaching a semiconductor chip including a bonding pad on each unit substrate by using the bump formed on each the bonding pads to connect the bonding pad of the semiconductor chip and the electrode terminal of the unit substrate; sealing the upper surface of the strip level substrate to surround the semiconductor chip; attaching the solder ball to the ball land in each unit substrate; and cutting the strip level substrate into the substrates of the unit level along with its scribe line.

The patterning of the solder resist is performed to also remove the solder resist applied on the parts of the strip level substrate other than the part that the unit substrate is disposed.

The electrode terminal is disposed on the center part of each unit substrate.

DESCRIPTION OF SPECIFIC EMBODIMENTS

The present invention performs a patterning of a solder resist to expose an electrode terminal and a ball land in each unit substrate of a strip level substrate through application of the solder resist on the front surface thereof such that the solder resist is removed together with the solder resist part applied on the scribe line dividing the unit substrate.

In contrast to the method of the prior art in which only the solder resist part applied on the electrode terminal and the ball land in each unit substrate is removed, the present invention minimizes the amount of the solder resist in the strip level substrate by also removing the solder resist applied on the scribe line which forms an independent boundary per unit substrate, making it possible to minimize an early warpage phenomenon of the strip level substrate caused at the time of a reflow of the solder resist.

Therefore, since the present invention minimizes the early warpage phenomenon of the strip level substrate, it easily and safely performs a manufacturing process of each unit level semiconductor package, thereby minimizing the degredation of the semiconductor package.

FIGS. 1A to 1E and FIGS. 2A to 2E are plan views and cross-sectional views, respectively, showing the process steps of a method for manufacturing a semiconductor package in accordance with an embodiment of the present invention. They will be described in detail.

Figure 1A:
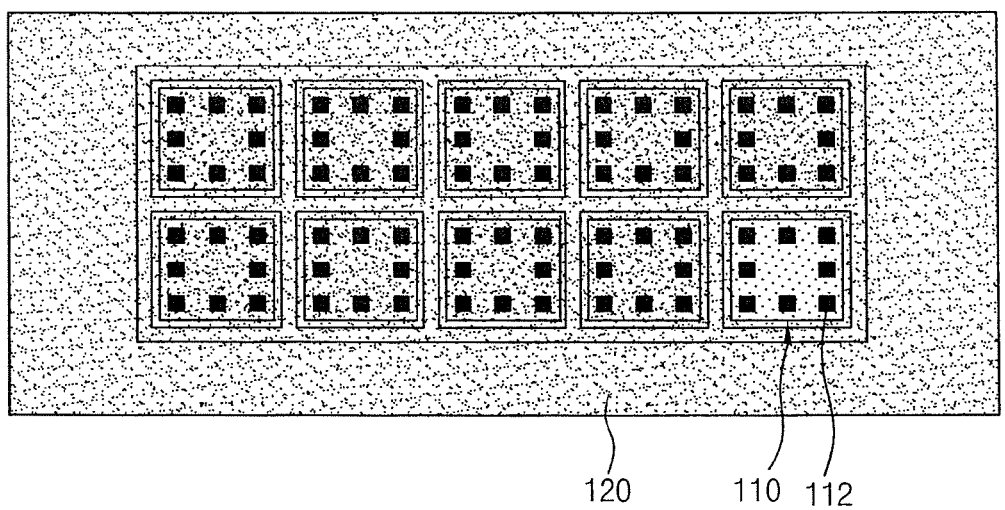
FIGS. 1A to 1E and FIGS. 2A to 2E are plan views and cross-sectional views, respectively, showing the process steps of a method for manufacturing a semiconductor package in accordance with an embodiment of the present invention.
Figure 2A:
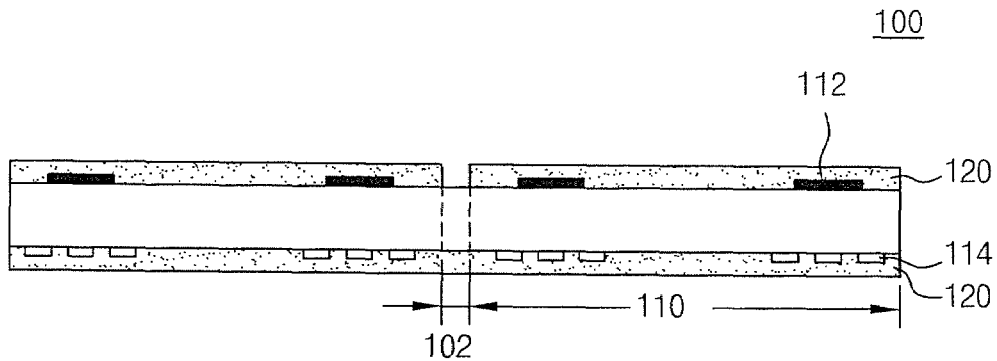

Referring to FIGS. 1A and 2A, a strip level substrate 100 has a plurality of unit substrates 110 including a plurality of electrode terminals 112 provided on the upper surface thereof and a plurality of ball lands 114 provided on the lower surface thereof and being divided with a scribe line 102. The electrode terminals of each unit substrate 110 are located on an edge part thereof.

A solder resist 120 is applied on the front surface of the strip level substrate 100 according to a typical process including a reflow process. Preferably, the solder resist 120 is applied to cover the electrode terminal 112 and ball land 114 of each unit substrate 110 in their entirety as well as the scribe line 102 demarcating the unit substrates 110.

Figure 1B:
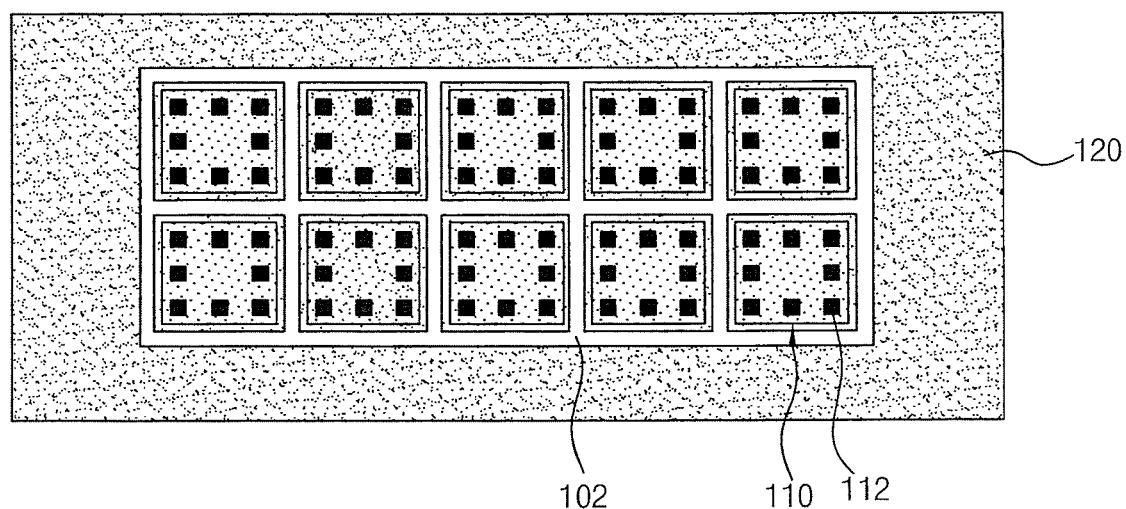
Figure 2B:
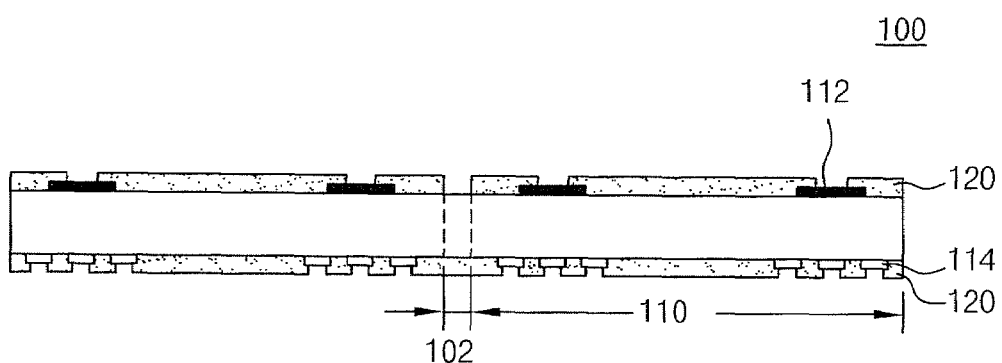

Referring to FIGS. 1B and 2B, the solder resist 120 is patterned to expose the electrode terminal 112 and the ball land 114 of each unit substrate 110. At this time, in contrast to the prior art, the patterning of the solder resist 120 is performed such that the portion of the solder resist 120 applied on the scribe line 102 dividing between the unit substrates 110 is also removed.

Figure 1C:
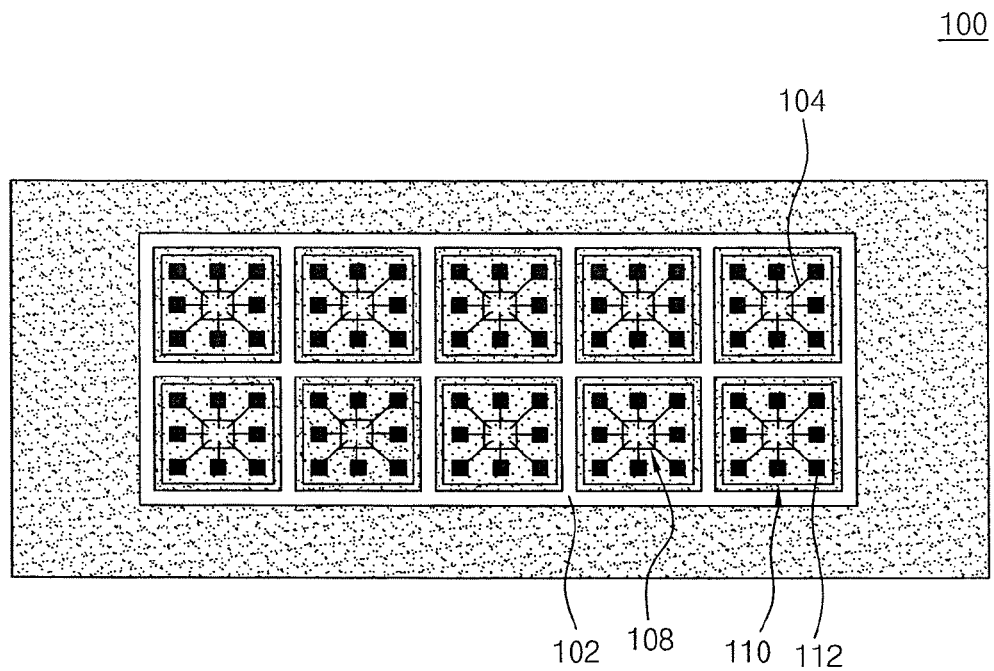
Figure 2C:
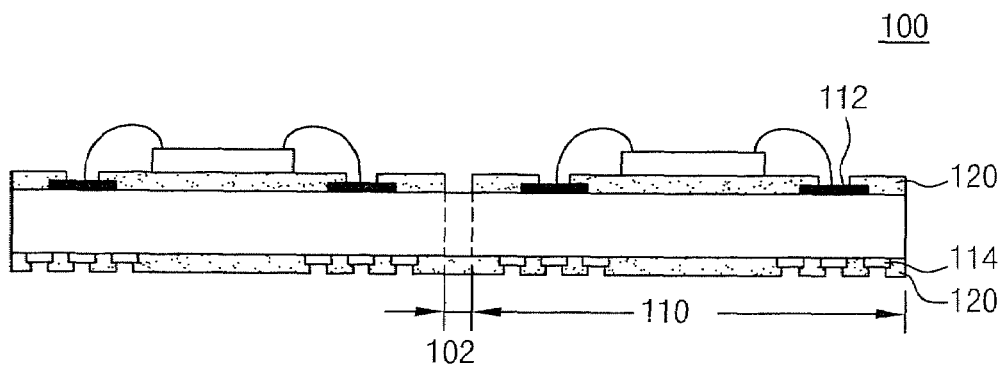

Referring to FIGS. 1C and 2C, a face-up type of a semiconductor chip 108 is attached on each unit substrate 110 such that the electrode terminal 112 and the ball land 114 of the strip level substrate 100 are exposed. The semiconductor chip 108, which preferably has an edge pad type structures, is attached to the central part of an inner side of the electrode terminal 112 of each unit substrate 110. The semiconductor chip 108 attached on the unit substrate 110 is electrically connected to the electrode terminal 112 of the unit substrate 110 by a metal wire 104.

Figure 1D:
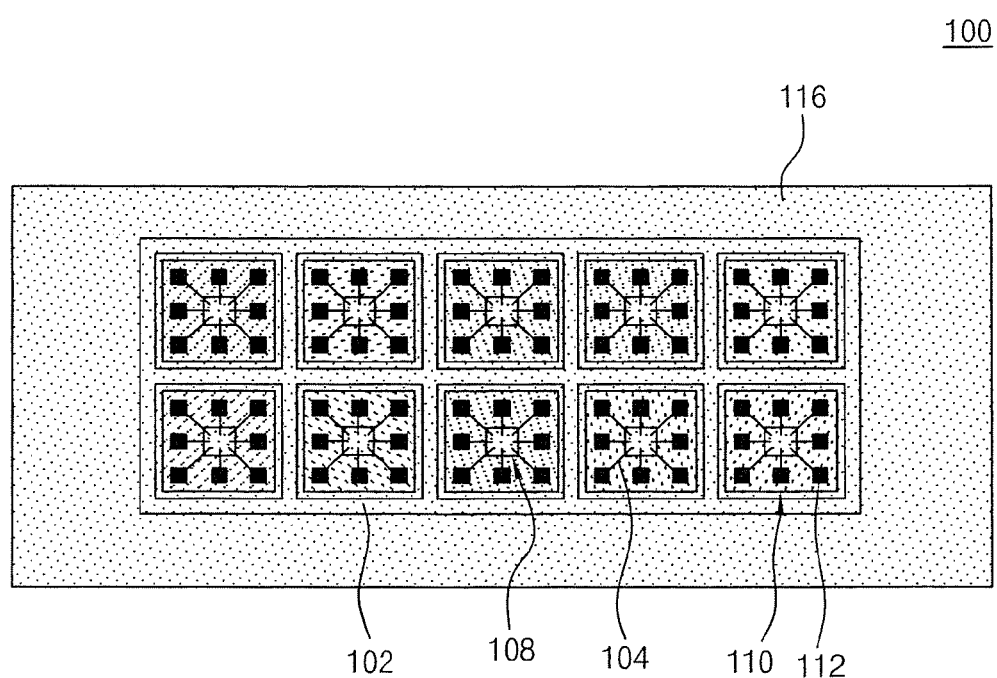
Figure 2D:
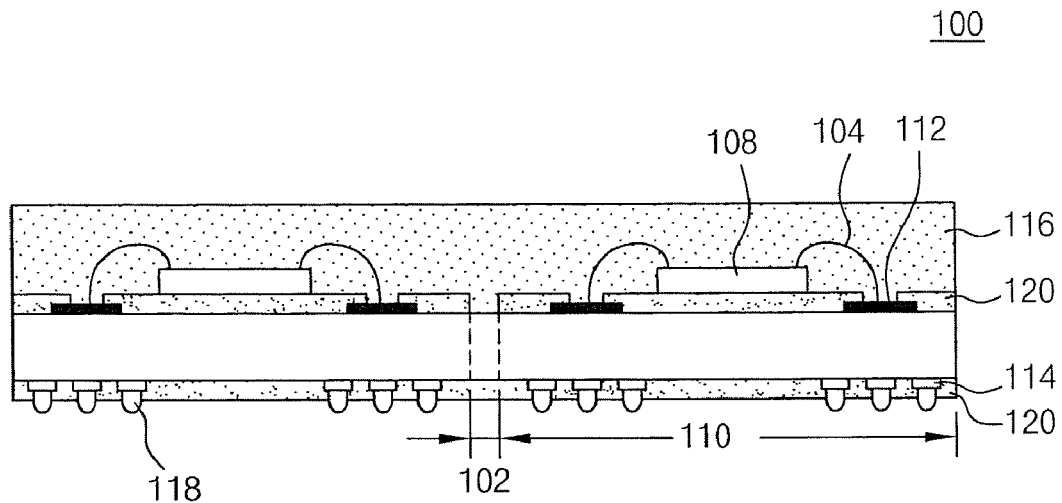

Referring to FIGS. 1D and 2D, the semiconductor chip 108 on the front surface of the strip level substrate 100 is sealed with an encapsulant 116 such as an epoxy mold compound (EMC) for protecting it from external stress. Thereafter, a solder ball 118 as a mounting means is attached to each ball land 114 on the lower surface of each unit substrate 110.

Figure 1E:
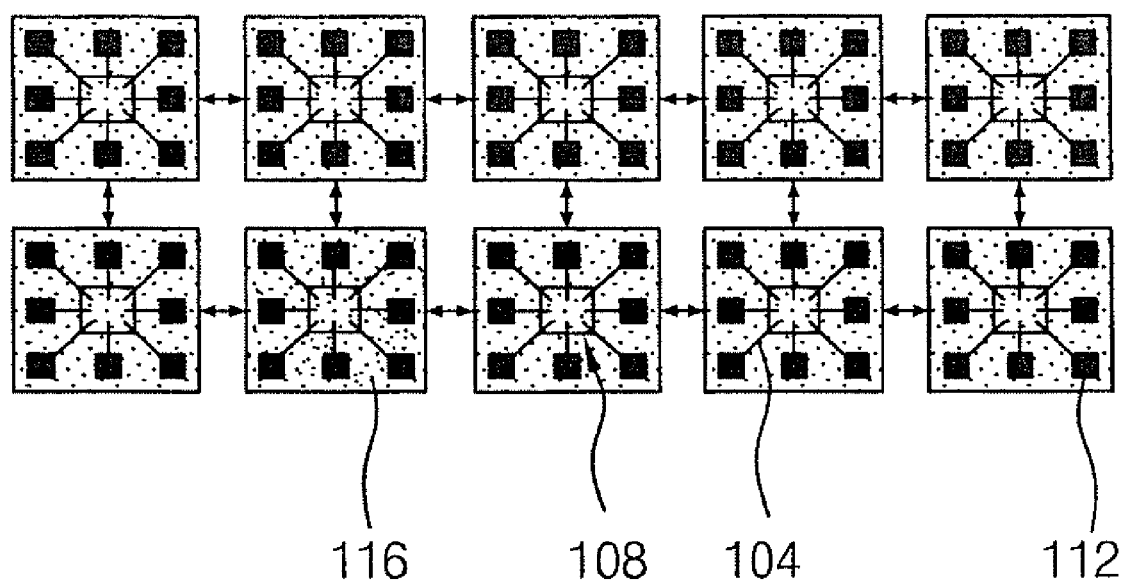
Figure 2E:
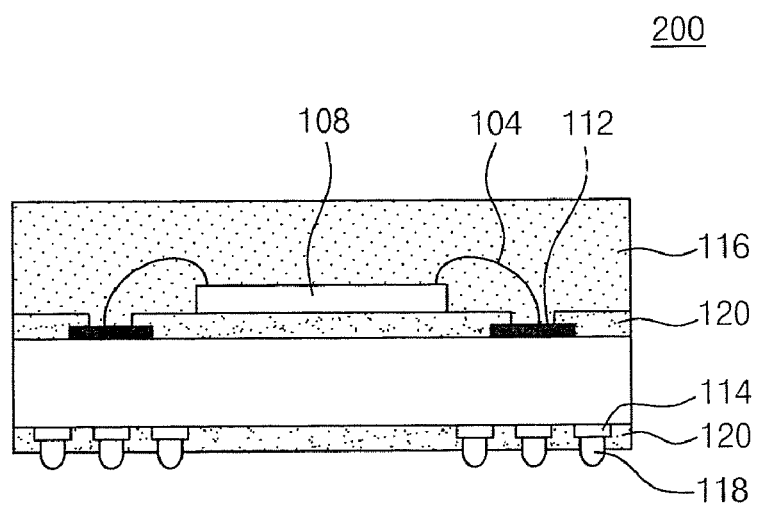

Referring to FIGS. 1E and 2E, the strip level substrate 100 sealed with the encapsulant 116 is cut into each unit level along its scribe line 102 to manufacture a semiconductor package 200 in accordance with an embodiment of the present invention.

As described above, when patterning the solder resist 120 portions applied on the electrode terminal 112 and ball land 114 of each unit substrate 110 to effect their removal, the present invention also simultaneously removes the portions of the solder resist 120 applied on the scribe line 102 to minimize the amount of solder resist 120 in the strip level substrate 100 as well as to form an independent boundary per neighboring unit substrate 110, thereby allowing the minimization of the early warpage phenomenon of the strip level substrate 100 caused during the reflow of the solder resist 120.

Therefore, the present invention minimizes the early warpage phenomenon of the strip level substrate, making it possible to increase the integrity of the whole manufacturing processes of the package and reduce degradation thereof.

FIGS. 3A to 3E and FIGS. 4A to 4E are plan views and cross-sectional views, respectively, showing the process steps of a method for manufacturing the semiconductor package in accordance with another embodiment of the present invention.

Figure 3A:
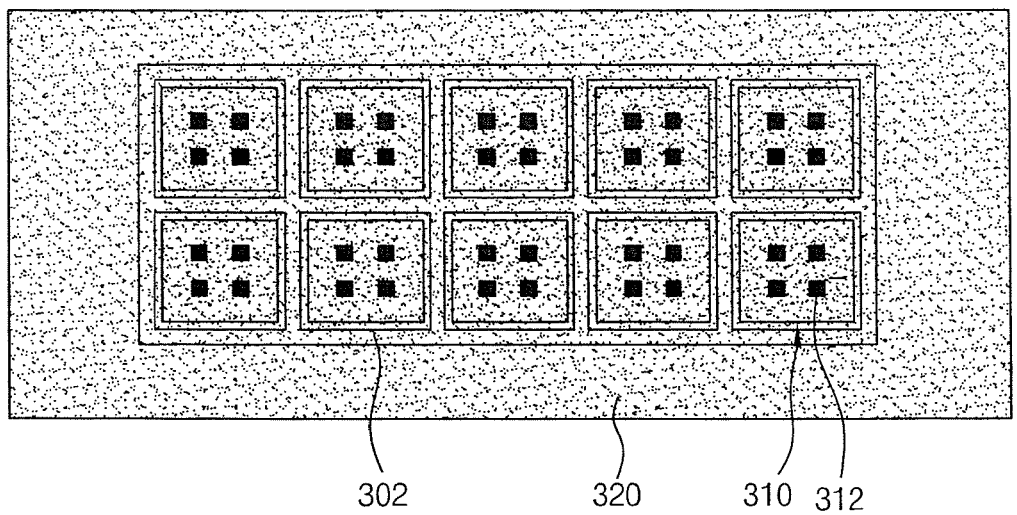
FIGS. 3A to 3E and FIGS. 4A to 4E are plan views and cross-sectional views showing the process steps of a method for manufacturing the semiconductor package in accordance with another embodiment of the present invention.
Figure 4A:
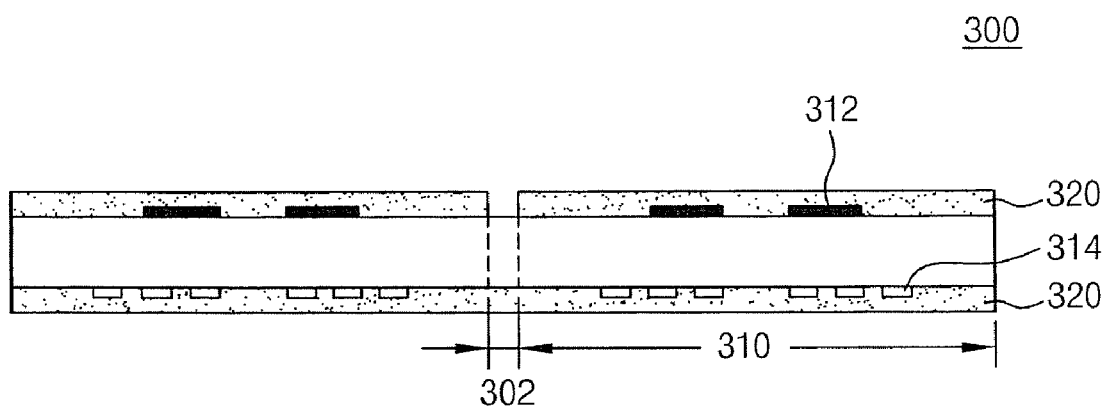

Referring to FIGS. 3A and 4A, a strip level substrate 300 has a plurality of unit substrates 310 including a plurality of electrode terminals 312 provided on the upper surface thereof and a plurality of ball lands 314 provided on the lower surface thereof and being divided by a scribe line 302. The electrode terminals 312 of each unit substrate 310 are located on the central part. Thereafter, a solder resist 320 is applied on the front surface of the strip level substrate 300.

Figure 3B:
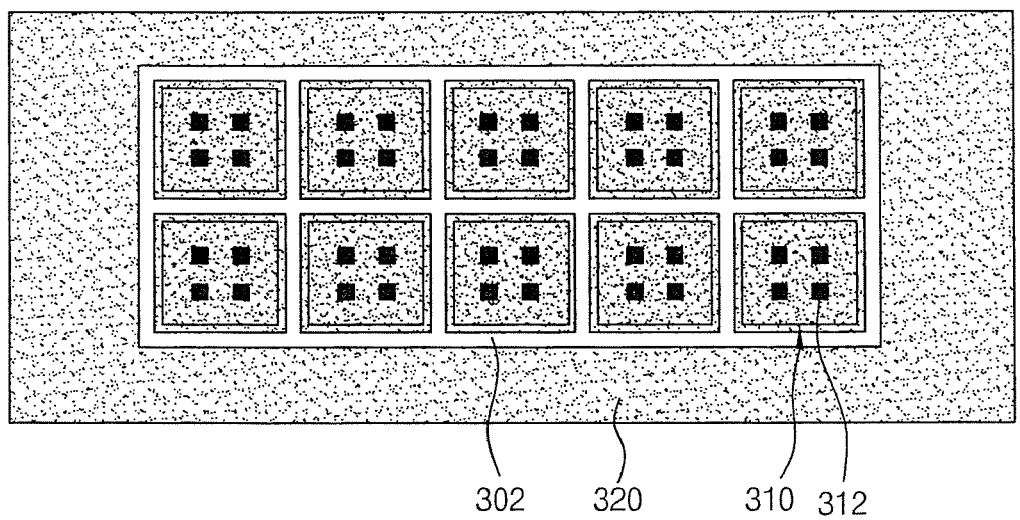
Figure 4B:
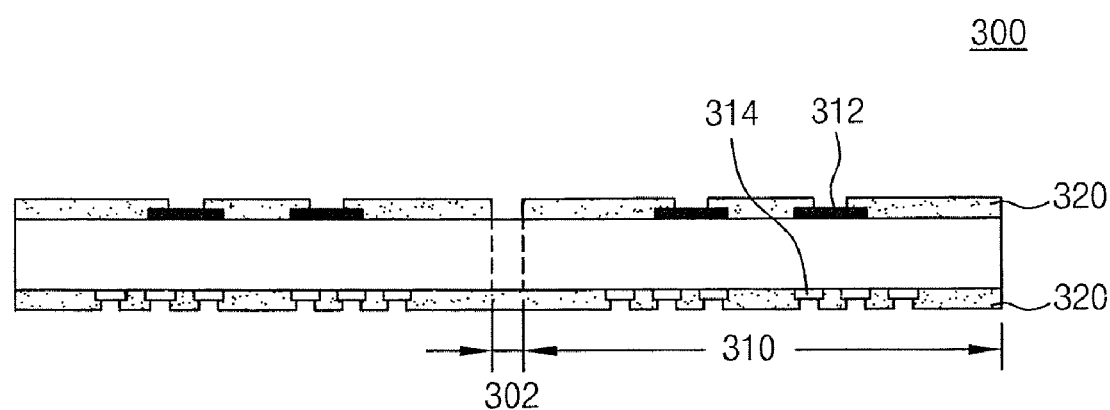

Referring to FIGS. 3B and 4B, the solder resist 320 is patterned to expose the electrode terminal 312 and the ball land 314 of each unit substrate 310. At this time, in contrast to the prior art, the patterning of the solder resist 320 is performed such that the portion of solder resist 320 applied on the scribe line 302 dividing between the unit substrates 310 is also removed.

Figure 3C:
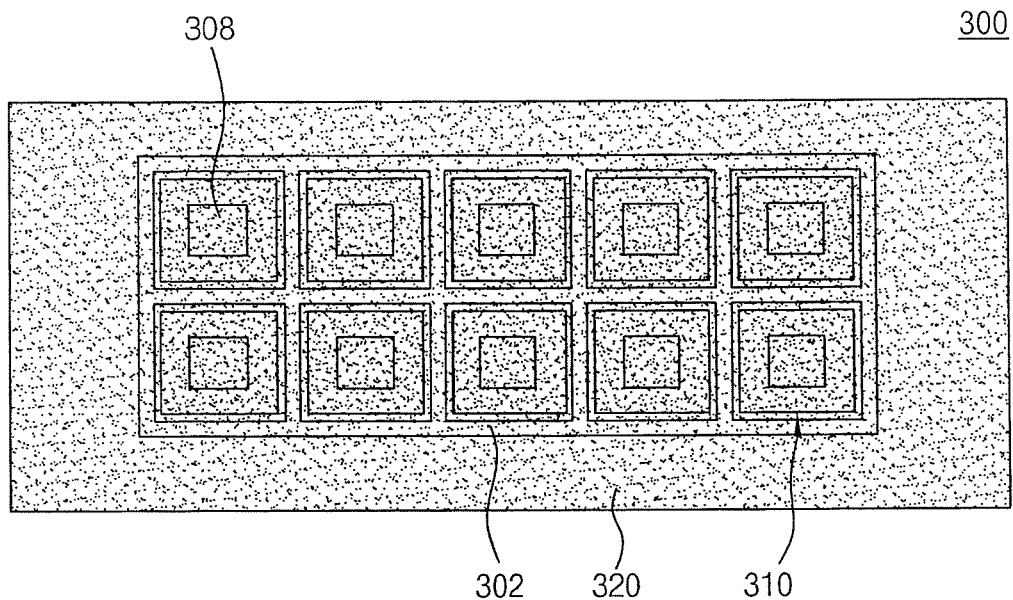
Figure 4C:
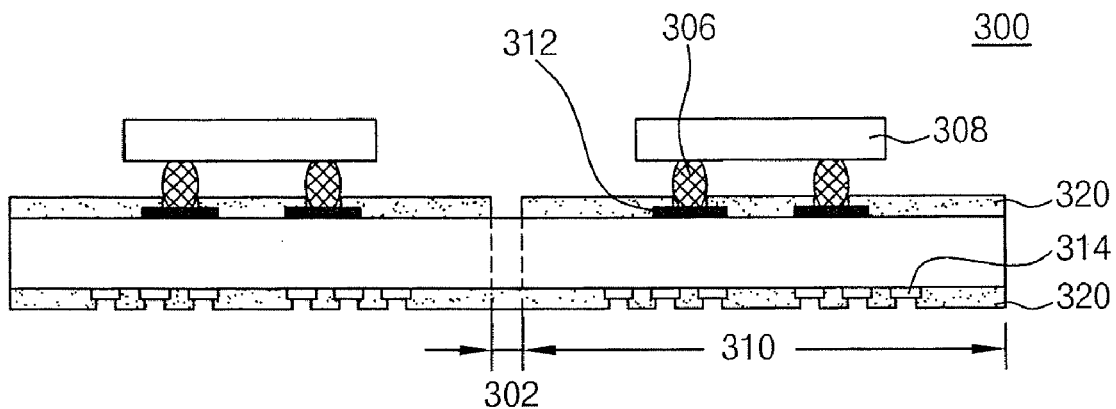

Referring to FIGS. 3C and 4C, a semiconductor chip 308 including a bump 306 is attached on the central part of each unit substrate 310 such that the electrode terminal 312 and ball land 314 of the unit level substrate 310 are exposed, through a flip chip manner using the bump 306. Thereby, the semiconductor chip 308 is electrically and mechanically connected to the unit substrate 310.

Figure 3D:
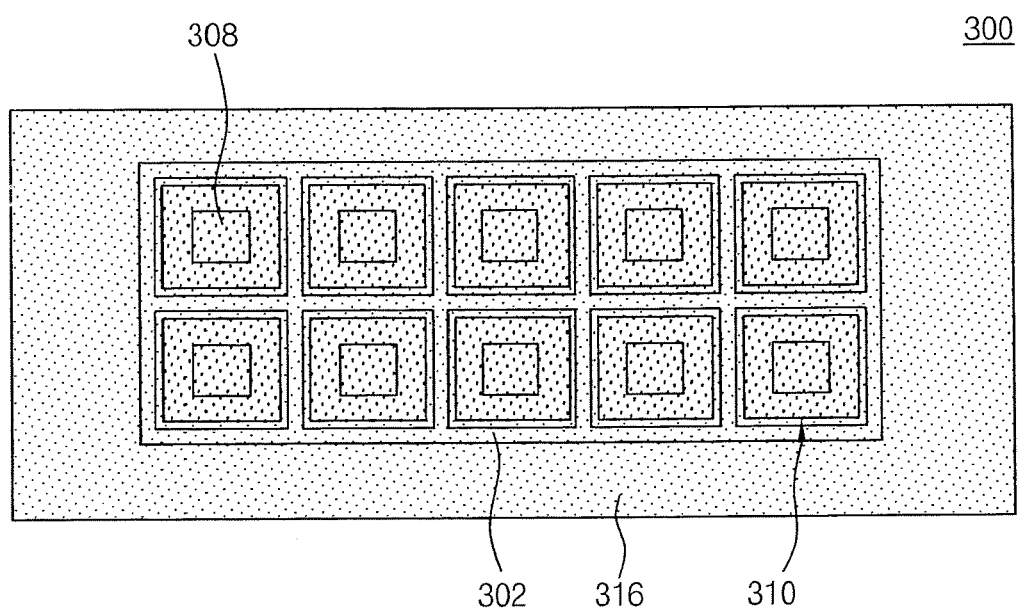
Figure 4D:
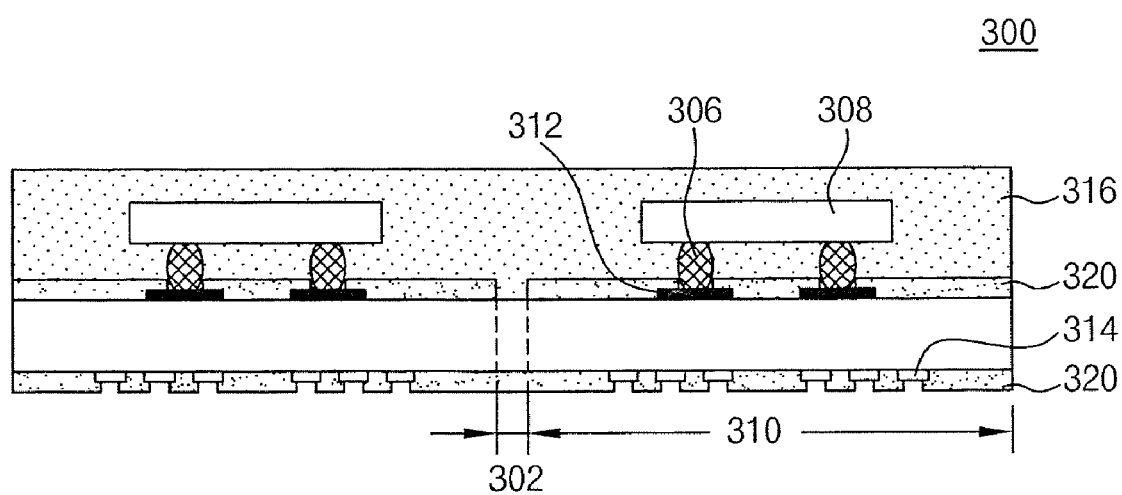

Referring to FIGS. 3D and 4D, the semiconductor chip 308 on the front surface of the strip level substrate 300 is sealed with an encapsulant 316 such as an epoxy mold compound (EMC) for protecting it from external stress. Thereafter, a solder ball 318 as a mounting means is attached to the ball land 314 on the lower surface of the unit substrate 310.

Figure 3E:
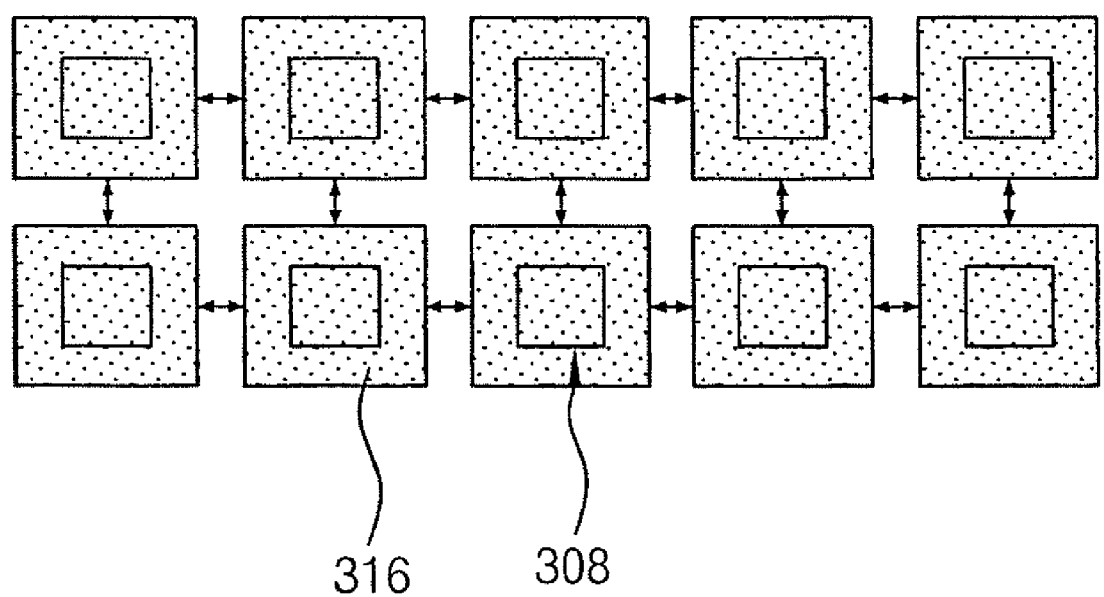
Figure 4E:
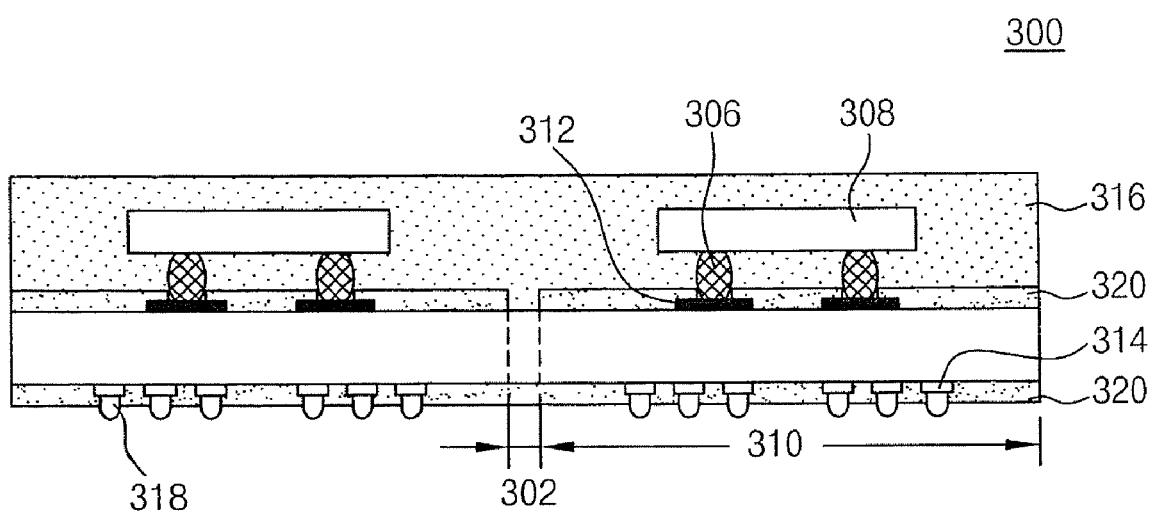

Referring to FIGS. 3E and 4E, the strip level substrate 300 sealed with the encapsulant 316 is cut into each unit level along its scribe line 302 to manufacture a flip chip package 400 in accordance with an embodiment of the present invention.

Likewise this embodiment, when patterning the solder resist 320 to expose the electrode terminal 312 and ball land 314 of the unit substrate 310, the present invention also removes the portion of solder resist 320 applied on the scribe line 302 to minimize the amount of solder resist 320 in the strip level substrate 300 as well as to form an independent boundary per unit substrate 310, making it possible to minimize the early warpage phenomenon of the strip level substrate 300 caused at the time of the reflow of the solder resist 320.

Therefore, since the present invention can minimize the early warpage phenomenon of the strip level substrate 300, the degradation of the flip chip package 400 of each unit substrate 310 is minimized, making it possible to easily and safely manufacture the flip chip package 400.

Figure 5:
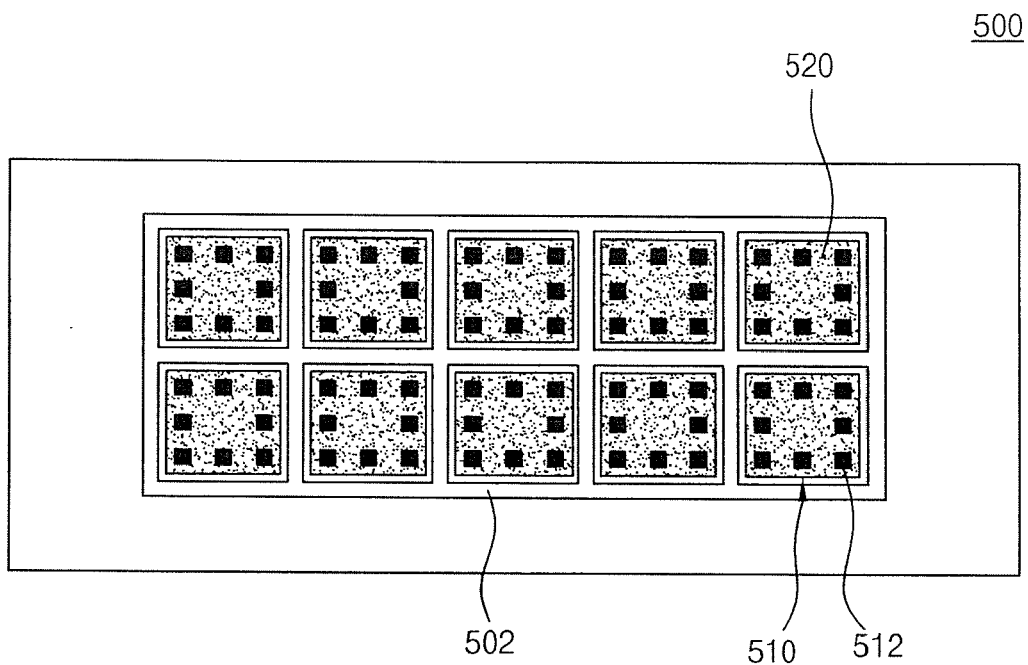
FIGS. 5 and 6 are plan views for showing a method for manufacturing the semiconductor package in accordance with another embodiment of the present invention.
Figure 6:
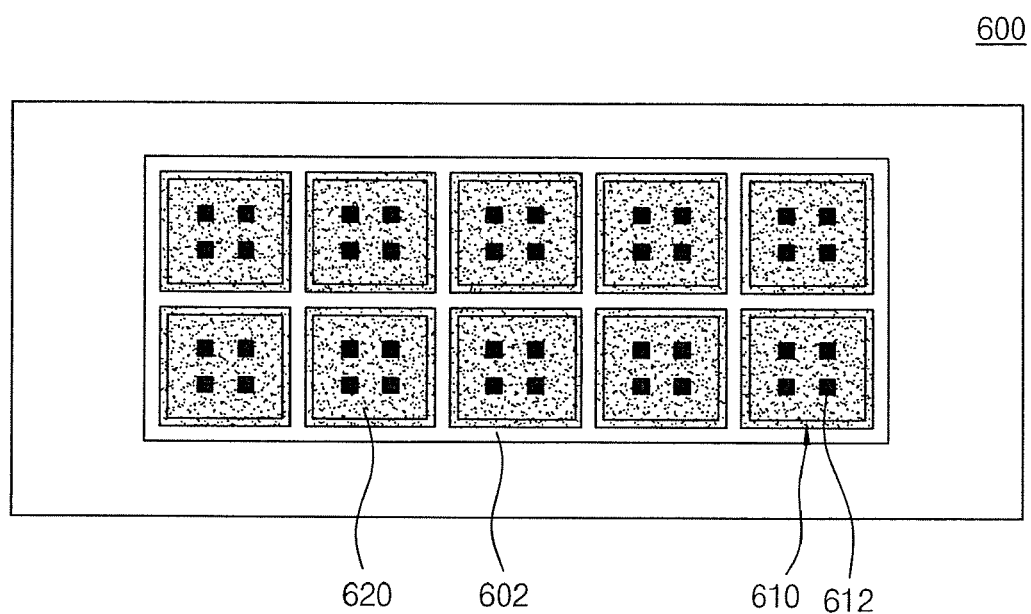

Referring to FIGS. 5 and 6, when patterning the solder resist to expose the electrode terminals and ball lands of each unit substrate, the patterning can simultaneously remove both the solder resist on the scribe lines and the portions of solder resist 520 and 620 applied on the part other than the part on which the unit substrates 510 and 610 of the strip level substrates 500 and 600 are disposed.

In this case, both the solder resist 520 and 620 parts applied on the scribe lines 502 and 602 dividing the unit substrates 510 and 610 and the solder resist 520 and 620 applied on the part other than the part on which the unit substrates 510 and 610 are disposed are removed, making it possible to increasingly reduce the early warpage phenomenon of the strip level substrates 500 and 600 caused at the time of the reflow of the solder resists 520 and 620.

In FIGS. 5 and 6, the reference numerals 512 and 612 represent an electrode terminal identical to that of the foregoing embodiment; therefore, the explanation thereof will be omitted herein.

As is apparent from the above description, when manufacturing the semiconductor package using the strip level substrate having a plurality of unit substrates demarcated by the scribe line, the present invention also removes the portion of solder resist applied on the scribe line when patterning the solder resist to expose the ball land and the electrode terminal of the unit substrate. The amount of the solder resist in the strip level substrate is therefore minimized and an independent boundary demarcating the unit substrates is formed such that the present invention can suppress the early warpage phenomenon of the strip level substrate caused at the time of the reflow of the solder resist. Since the present invention minimizes the early warpage phenomenon of the strip level substrate, it minimizes the degradation of the semiconductor package of each unit level, making it possible to easily and safely perform the manufacturing process of the semiconductor package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a strip level substrate comprising the steps of:
    applying solder resist to an upper surface of a substrate and to a lower surface of the substrate, the substrate having a plurality of unit substrates divided by a scribe line; and
    patterning the applied solder resist to expose an electrode terminal and a ball land in each unit substrate,
    wherein the step of patterning the solder resist also includes removing the solder resist on the scribe lines on the upper surface of the substrate, so as to prevent early warpage of the strip level substrate, and
    wherein the solder resist on the scribe line of the lower surface of the substrate is not removed.

2. The method for manufacturing a strip level substrate according to claim 1, wherein the step of patterning the solder resist also includes removing any additional solder resist applied to the substrate that is not a part of the unit substrate or the scribe lines.

3. A method for manufacturing a semiconductor package comprising steps of:
    applying solder resist to an upper surface of a strip level substrate and to a lower surface of the strip level substrate, the strip level substrate having a plurality of unit substrates divided by a scribe line, each unit substrate including an electrode terminal and a ball land;
    patterning the solder resist to expose the electrode terminal, the ball land, and the solder resist on the scribe line of the upper surface of the strip level substrate, wherein the solder resist on the scribe line of the lower surface of the strip level substrate is not removed;
    attaching a semiconductor chip having a bonding pad on each unit substrate;
    connecting the bonding pad of the semiconductor chip and the electrode terminal of the unit substrate;
    sealing the surface of the strip level substrate to surround the semiconductor chip;
    attaching a solder ball to the ball land of each unit substrate; and
    cutting the strip level substrate along the scribe line so as to produce at least one piece of unit level substrate.

4. The method for manufacturing the semiconductor package according to claim 3, wherein the step of patterning the solder resist also includes removing any additional solder resist applied to the strip level substrate that is not a part of the unit substrate or the scribe lines.

5. The method for manufacturing the semiconductor package according to claim 3, wherein the electrode terminal is disposed on an edge part of each unit substrate.

6. The method for manufacturing the semiconductor package according to claim 3, wherein the semiconductor chip is attached on a center part of the unit substrate.

7. The method for manufacturing the semiconductor package according to claim 3, wherein the step of connecting the bonding pad of the semiconductor chip with the electrode terminal of the unit substrate is performed by a metal wire.

8. A method for manufacturing a semiconductor package includes the steps of:
    applying solder resist to an upper surface of a strip level substrate and to a lower surface of the strip level substrate, the strip level substrate having a plurality of unit substrates demarcated by a scribe line, each unit substrate including an electrode terminal and a ball land;

patterning the solder resist to expose the electrode terminal, the ball land, and the solder resist on the scribe line of the upper surface of the strip level substrate, wherein the solder resist on the scribe line of the lower surface of the strip level substrate is not removed;

attaching a semiconductor chip having a bonding pad on each unit substrate and a bump formed on the bonding pad;

connecting the bump formed on the bonding pad of the semiconductor chip and the electrode terminal of the unit substrate;

sealing the surface of the strip level substrate to surround the semiconductor chip;

attaching a solder ball to the ball land of each unit substrate; and cutting the strip level substrate along the scribe line so as to produce at least one piece of unit level substrate.

9. The method for manufacturing the semiconductor package according to claim 8, wherein the step of patterning the solder resist also includes removing any additional solder resist applied to the strip level substrate that is not a part of the unit substrate or the scribe lines.

10. The method for manufacturing the semiconductor package according to claim 8, wherein the electrode terminal is disposed on a center part of each unit substrate.

* * * * *